United States Patent
Hönel et al.

(10) Patent No.: US 8,715,888 B2
(45) Date of Patent: *May 6, 2014

(54) METHOD FOR PRODUCING HOLOGRAPHIC PHOTOPOLYMERS ON POLYMER FILMS

(75) Inventors: Dennis Hönel, Zülpich (DE); Marc-Stephan Weiser, Leverkusen (DE); Friedrich-Karl Bruder, Krefeld (DE); Thomas Rölle, Leverkusen (DE); Thomas Fäcke, Leverkusen (DE)

(73) Assignee: Bayer MaterialScience AG, Leverkusen (DE)

( * ) Notice: Subject to any disclaimer, the term of this patent is extended or adjusted under 35 U.S.C. 154(b) by 115 days.

This patent is subject to a terminal disclaimer.

(21) Appl. No.: 13/148,694

(22) PCT Filed: Jan. 30, 2010

(86) PCT No.: PCT/EP2010/000565
§ 371 (c)(1),
(2), (4) Date: Aug. 10, 2011

(87) PCT Pub. No.: WO2010/091795
PCT Pub. Date: Aug. 19, 2010

(65) Prior Publication Data
US 2011/0311905 A1    Dec. 22, 2011

(30) Foreign Application Priority Data
Feb. 12, 2009 (EP) .................................... 09001952

(51) Int. Cl.
*G03H 1/02* (2006.01)
*G03H 1/04* (2006.01)
*G03F 7/035* (2006.01)
*C08G 18/10* (2006.01)
*C08G 18/48* (2006.01)
*C08J 7/04* (2006.01)
*C08G 18/77* (2006.01)
*C09D 175/08* (2006.01)

(52) U.S. Cl.
CPC . *G03H 1/02* (2013.01); *G03H 1/04* (2013.01); *G03H 2260/30* (2013.01); *G03H 2260/12* (2013.01); *G03F 7/035* (2013.01); *C08G 18/10* (2013.01); *C08G 18/48* (2013.01); *C08G 18/77* (2013.01); *C08J 7/04* (2013.01); *C09D 175/08* (2013.01)
USPC ........ 430/1; 430/2; 359/3; 427/162; 427/487; 427/532; 427/541

(58) Field of Classification Search
None
See application file for complete search history.

(56) References Cited

U.S. PATENT DOCUMENTS 3,667,946 A * 6/1972 Sturdevant ........................ 430/1
5,083,219 A * 1/1992 Jannson et al. .................... 359/1

(Continued)

FOREIGN PATENT DOCUMENTS

DE        3822093       *  1/1989
DE        19754024 A1      6/1999

(Continued)

OTHER PUBLICATIONS

"Products and Properties, Reactive Adhesives, Commercial and trial products", Bayer MaterialScience, 20 pages (May 2006).*

(Continued)

*Primary Examiner* — Martin Angebrannt
(74) *Attorney, Agent, or Firm* — Novak Druce Connolly Bove + Quigg LLP (57) ABSTRACT

The invention relates to a method for producing novel photopolymers on the basis of prepolymer-based polyurethane compositions that are suitable for producing holographic media, in particular for the visual display of images.

14 Claims, 8 Drawing Sheets

(56) References Cited

U.S. PATENT DOCUMENTS

| | | | |
|---|---|---|---|
| 6,344,495 B1* | 2/2002 | Ueda et al. | 522/96 |
| 6,414,761 B1* | 7/2002 | Stepanek | 359/2 |
| 8,361,678 B2* | 1/2013 | Weiser et al. | 430/1 |
| 2003/0044691 A1* | 3/2003 | Setthachayanon et al. | 430/1 |
| 2003/0124436 A1* | 7/2003 | Shioda et al. | 430/1 |
| 2005/0200033 A1* | 9/2005 | Kadota et al. | 264/1.31 |
| 2005/0222365 A1* | 10/2005 | Mager et al. | 528/73 |
| 2007/0166625 A1* | 7/2007 | Cole et al. | 430/1 |
| 2008/0312403 A1* | 12/2008 | Stockel et al. | 528/59 |
| 2010/0086860 A1 | 4/2010 | Roelle et al. | |
| 2010/0086861 A1* | 4/2010 | Weiser et al. | 430/2 |
| 2010/0112459 A1 | 5/2010 | Weiser et al. | |
| 2010/0203241 A1* | 8/2010 | Weiser et al. | 427/162 |
| 2011/0189591 A1* | 8/2011 | Weiser et al. | 430/2 |
| 2011/0207029 A1* | 8/2011 | Hagen et al. | 430/2 |
| 2011/0311906 A1* | 12/2011 | Rolle et al. | 430/2 |

FOREIGN PATENT DOCUMENTS

| | | | |
|---|---|---|---|
| EP | 2172502 A1 | 4/2010 | |
| EP | 2172505 A1 | 4/2010 | |
| JP | 2001187362 A | 7/2001 | |
| WO | WO-2008/125199 A1 | 10/2008 | |
| WO | WO-2010/037496 A1 | 4/2010 | |
| WO | WO-2010/037515 A1 | 4/2010 | |

OTHER PUBLICATIONS

Schweizer, P.M., *Vordosierte Beschichtungsverfahren: Vorzüge und Anwendungen* [*Premetered coating methods: advantages and applications*], Troller Schweizer Engineering AG, Coating, Dec. 1998 edition, pp. 462-465.

Schmalz, M., et al., 5-oder 6-Walzen Beschichtungs-verfahren zur Silikonisierung mit thermisch und UV härtbaren Silikonen [5- or 6-Roller Coating Processes for Siliconization with thermic and UV curable Silicones], Maschinenfabrik Max Kroenert Gmbh & Co. KG, Coating, Oct. 2006 edition, pp. 410-413.

Kogelnik, H., *Coupled Wave Theory for Thick Hologram Gratings* (1969), The Bell System Technical Journal, vol. 48, No. 9, pp. 2909-2947.

\* cited by examiner

METHOD FOR PRODUCING HOLOGRAPHIC PHOTOPOLYMERS ON POLYMER FILMS

CROSS-REFERENCE TO RELATED APPLICATIONS

This application is a national stage application (under 35 U.S.C. §371) of PCT/EP2010/000565, filed Jan. 30, 2010, which claims benefit of European application 09001952.2, filed Feb. 12, 2009, both of which are incorporated herein by reference in their entirety for all their useful purposes.

BACKGROUND

The invention relates to a method for the preparation of novel photopolymers based on prepolymer-based polyurethane compositions which are suitable for the production of holographic media, in particular for the visual display of images.

Photopolymers are materials which can be exposed by means of the superposition of two coherent light sources, resulting in a three-dimensional structure in the photopolymers, which generally can be written in the material by a regional change of the refractive index. Such structures are referred to as holograms. They may also be described as diffractive optical elements. The optical functions developed by such a hologram depend on the specific exposure to light.

Polymer formulations for the production of holographic media are described, inter alia, in the non-prior-published patent applications EP 08017279.4, EP 08017277.8, EP 08017273.7, EP 08017275.2. EP 08017277.8 and EP 08017273.7 describe polyether-based and prepolymer-based polyurethane compositions which are in general suitable for the production of holographic media. Polyurethane formulations which comprise specific acrylates and are suitable for the recording of holograms were described in EP 08017275.2. Furthermore, a typical film structure and the application of various polyurethane formulations as a photopolymer in the film composite was described for the first time in EP 08017279.4.

The production of such holographic media as a glass or film composite has been effected in the prior art to date in individual process steps which are not suitable for production in a manner similar to manufacture and to meet requirements.

For the production of such film composites in a manner similar to manufacture, film coating units which are to be understood as a continuously operated roll-to-roll process are used. In general, film coating is understood as meaning the application of a liquid substance to a moving film material. The coating processes differ, inter alia, according to the properties of the layer to be applied (e.g. viscosity, surface tension, solids concentration, etc.), the target layer thickness to be applied or the manufacturing speed.

The film coating units to be used for manufacture typically consist of:

Unwinding from a roll, which ensures the feeding of the support material (film substrate).

Pretreatment of the coating material: accessory units and peripheral devices, such as, for example dissolvers and kneading units, weighing systems, various pump systems, automatic solids feeds, consumption measuring systems, filter units, devolatilization devices and mixing systems are used for the pretreatment.

Pretreatment of the support material: in the coating industry, web cleaning systems for cleaning the support material, ionization units known to the person skilled in the art and intended for homogenizing the electrical charges present on the support material, plasma and corona treatments are used as pretreatment units. Furthermore, web control systems which are supported by devices such as, for example, web edge control and web storage systems are used.

Application system for applying a coating material: various knife coater and spreading systems, feed hoppers with slot die and roller application systems are used in the coating industry as application systems, as well as systems such as, for example, curtain and cascade processes for multilayer application.

Coating devices which can be used, such as, for example, curtain or cascade coaters or slot nozzles, are described in earlier publications, for example (P. M. Schweizer, "Vordosierte Beschichtungsverfahren: Vorzüge and Anwendungen [Premetered coating methods: advantages and applications]", Coating, December 1998 edition, pages 462-465): thus, Schweizer describes premetered coating methods which were developed as long ago as the fifties, inter alia in the photographic industry. In these methods, liquid is distributed transversely to the support material by homogeneous pressure distribution within a nozzle. These methods are used for single-layer as well as for multilayer products (slot nozzle ≤3, cascade and curtain methods with >10). In the slot and cascade methods, the nozzle is separated from the support material only by a very narrow gap. In the curtain method, the nozzle is present several centimeters away from the support material so that the liquid distribution is substantially decoupled from the coating process.

Further, all customary roll application systems, which differ specifically through the arrangement, designs and number of rolls, are used. The coating material to be applied can be stored either in a tank or in the gap between two horizontally arranged rolls for metering. In all cases, the rotation speed of the wetted rolls, the nature (engraving, smooth rolls) of the rolls, viscosity and surface tension influence the layer thickness to be applied, in relation to the substrate speed. In addition, with increasing substrate speeds, further rolls are used which result in further extension of the coating material through differently adapted rotation speeds of the rolls and a defined nip between the two rolls. The last roll of the system is a very small distance away from the support material, and the coating material is therefore pressed onto the support material either in countercurrent or in cocurrent operation. Roll speed, nip, support material speed and the viscosity are decisive factors in establishing the desired wet layer thicknesses.

A 5- or 6-roll application system is described, for example, by Maschinenfabrik Max Kroenert GmbH & Co. KG (M. Schmalz, N. Hansen, W. Neumann, "5-oder 6-Walzen Beschichtungsverfahren [5- or 6-Roll coating method]", Coating, October 2006 edition, pages 410-413). In this publication, the authors compare the advantages and disadvantages of a 5-roll to a 6-roll application system on the basis of a solvent-free silicone coating with thermally curable or UV-curable silicones.

Dryer units: inter alia, hot air dryers with prethermostated air, IR lamps or UV devices are used for drying the coating material on the support material. Chill rolls, expander rolls, laminating units, calender rolls, cutting devices (such as, for example, edge cutters) are used for the aftertreatment of the coated support materials. In addition, said processes can also be used for solvent-containing systems and are therefore equipped as an explosion-proof unit.

Winding device for winding the coated product or support film.

Said process steps are supplemented in the coating industry additionally by systems for quality assurance, such as, for example, layer thickness measurements, optical surface monitoring systems, atmospheric humidity or solvent concentration measurements and residual product moisture measurements.

It was an object of the present invention to provide an industrial process by means of which holographic photopolymer films can be produced in a continuous production procedure starting from prepolymer-based polyurethane formulations. The product is to be a film composite comprising cast film, photopolymer and an outer film.

This object was achieved by the specific combination of different process steps in which positive metering pumps known to the person skilled in the art, vacuum devolatilizers, plate filters, static mixers, slot nozzles or various knife coating systems, single-roll unwinders, air dryers, dry lamination device and a single-roll winding device are used. In particular, the coating device, such as, for example, slot nozzles and knife coating systems, are suitable for the application of liquid coating materials, especially in combination with photopolymer formulations, preferably prepolymer-based polyurethane formulations of the following compositions, to moving support materials and are distinguished by high accuracy in the application layer thickness.

BRIEF DESCRIPTION OF PREFERRED EMBODIMENTS

The present invention relates to a continuous process for the production of photopolymer films, in which a support film is coated by the roll-to-roll principle with a photopolymer formulation comprising
A) a polyisocyanate component, at least containing an NCO-terminated polyurethane prepolymer whose NCO groups are primarily aliphatically bonded and which is based on hydroxy-functional compounds having an OH functionality of 1.6 to 2.05,
B) isocyanate-reactive polyether polyols
C) urethane acrylates and/or urethane methacrylates having at least one aromatic structural unit and a refractive index of greater than 1.50 at 405 nm, which themselves are free of NCO groups and OH groups
D) free radical stabilizers
E) photoinitiators based on combinations of borate salts and one or more dyes having absorption bands which at least partly cover the spectral range from 400 to 800 nm
F) optionally catalysts
G) optionally auxiliaries and additives.

The invention furthermore relates to photopolymer films which are obtainable by the process according to the invention and are suitable for recording visual holograms, and the further use thereof as optical elements or images or for image display or projection.

DETAILED DESCRIPTION OF PREFERRED EMBODIMENTS

Prepolymers which can be obtained in a manner well known per se to the person skilled in the art by reacting monomeric, oligomeric or polyisocyanates A1) with isocyanate-reactive compounds A2) in suitable stoichiometry with optional use of catalysts and solvents are used in component A). Preferred prepolymers are urethanes or allophanates of aliphatic isocyanate-functional compounds and oligomeric or polymeric isocyanate-reactive compounds, the prepolymers having number-average molar masses of 200 to 10 000 g/mol and NCO functionalities of 1.9 to 5.0. Difunctional urethanes and allophanates having functionalities of greater than 1.9 to 3.2 or of 3.9 to 4.2 with number average molar masses of 650 to 8200 g/mol, prepared from aliphatic isocyanate-functional compounds and oligomeric or polymeric polyols or any desired mixtures thereof, are particularly preferred. Urethanes having NCO functionalities of 1.9 to 2.1 and number average molar masses of 1900 to 4100 g/mol, prepared from aliphatic isocyanate-functional compounds and oligomeric or polymeric polyols and allophanates having functionalities of greater than 2.0 to 3.2 or of 3.9 to 4.2 with number average molar masses of 1900 to 4100 g/mol, prepared from aliphatic isocyanate-functional compounds and oligomeric or polymeric polyols or any desired mixtures thereof, are very particularly preferred.

Isocyanate-reactive polyether polyols which preferably have on average at least 1.5 isocyanate-reactive groups per molecule are used as component B). Preferred compounds of component B) are poly(propylene oxides), poly(ethylene oxide) and combinations thereof in the form of random or block copolymers, and block copolymers of propylene oxide and/or ethylene oxide. The proportion of ethylene oxide, based on percent by weight of the total product, is preferably less than 55%, particularly preferably either between 55% and 45% or less than 30% and very particularly preferably less than 10%. Difunctional polyether polyols, based on propylene oxide and ethylene oxide and having a proportion of ethylene oxide of less than 10 percent by weight, based on the total mass of the parent polyether, and a number average molar mass between 2000 and 4200 g/mol are used as very particularly preferred compounds of component B). The components A) and B) are used in the preparation of the photopolymer formulation in an OH/NCO ratio to one another of typically from 0.9 to 1.2, preferably from 0.95 to 1.05.

Urethane acrylates and/or urethane methacrylates having at least one aromatic structural unit and a refractive index of greater than 1.50 at 405 nm are preferably used in component C). Urethane(meth)acrylates are understood as meaning compounds having at least one acrylate or methacrylate group, which additionally have at least one urethane bond. Particularly preferred compounds to be used as component C) are urethane acrylates and urethane methacrylates based on aromatic isocyanates and 2-hydroxyethyl acrylate, hydroxypropyl acrylate, 4-hydroxybutyl acrylate, polyethylene oxide mono(meth)acrylate, polypropylene oxide mono (meth)acrylate, polyalkylene oxide mono(meth)acrylate and poly(ε-caprolactone)mono(meth)acrylates. In a very particularly preferred embodiment, the adducts of aromatic triisocyanates (very particularly preferably tris(4-phenylisocyanato) thiophosphate or trimers of aromatic diisocyanates, such as toluylene diisocyanate) with hydroxyethyl acrylate, hydroxypropyl acrylate, 4-hydroxybutyl acrylate are used as component C). In a further very particularly preferred embodiment, adducts of 3-thiomethylphenyl isocyanate with hydroxyethyl acrylate, hydroxypropyl acrylate, 4-hydroxybutyl acrylate are used as component C.

Inhibitors and antioxidants are suitable as compounds of component D). 2,6-di-tert-butyl-4-methylphenol, phenothiazine, p-methoxyphenol, 2-methoxy-p-hydroquinone and benzhydrol are preferred.

One or more photoinitiators are used as component E). Preferred photoinitiators E) are mixtures of tetrabutylammonium tetrahexylborate, tetrabutylammonium triphenylhexylborate, tetrabutylammonium tris(3-fluorophenyl)hexylborate and tetrabutylammonium tris-(3-chloro-4-methylphenyl)hexylborate (component E1)) with dyes, such as, for example, astrazon orange G, methylene blue, new methylene blue, azure A, pyrillium I, safranine O, cyanine, gallocyanine, brilliant green, crystal violet, ethyl violet and thionine (component E2)). The combination of a blue-sensitive, a green-sensitive and a red-sensitive dye (e.g. astrazon orange G, ethyl violet and new methylene blue) and one of the abovementioned borate salts is particularly preferred.

Optionally, one or more catalysts can be used as compounds of component F). Dibutyltin dilaurate, dimethylbis[(1-oxoneodecyl)oxy]stannane, dimethyltin dicarboxylate, 1,4-diazabicyclo[2.2.2]octane, diazabicyclononane, diazabicycloundecane, 1,1,3,3-tetramethylguanidine, 1,3,4,6,7,8-hexahydro-1-methyl-2H-pyrimido[1,2-a]pyrimidine are preferred.

Of course, optionally further additives G) may be used. These may be, for example, additives customary in the area of coating technology, such as solvents, plasticizers, levelling agents, antifoams or adhesion promoters. Plasticizers used are preferably liquids having good dissolving properties, a low volatility and a high boiling point. Surface-active compounds, such as, for example, polydimethylsiloxanes, can be used as levelling agents. It may also be advantageous simultaneously to use a plurality of additives of one type. Of course, it may also be advantageous to use a plurality of additives of a plurality of types.

Particularly preferably, the photopolymer formulations described comprise:
18 to 30% by weight of component A)
35 to 57.37% by weight of component B)
20 to 35% by weight of component C)
0.02 to 0.1% by weight of free radical stabilizers D)
1 to 1.5% by weight of photoinitiators E1)
in each case 0.03 to 0.1% by weight of the three dyes E2) which are tailored in the absorption spectrum to the red, green and blue laser wavelengths
0.02 to 0.1% by weight of catalysts F)
3.5 to 5% by weight of auxiliaries and additives G).

In a preferred embodiment, the process for coating the support film comprises the following individual steps for the treatment of abovementioned photopolymer compounds:

I. transport and metering firstly of the component A), optionally mixed with one or more of the components E), F) and G), and secondly, separately therefrom, of the component B), optionally mixed with one or more of the components C), D), E), F) and G)
II. devolatilization of the streams transported, metered and optionally premixed according to I)
III. filtration of the mixture obtained according to II)
IV. homogenization of the mixture obtained according to III)
V. unrolling and pretreatment of the support material
VI. coating the support material with the mixture obtained according to step IV)
VII. drying of the film coated according to VI)
VIII. lamination of the coated film obtained according to VII)
IX. rolling up of the laminated film obtained according to VIII)

All pump systems which are known to the person skilled in the art and in particular transport precisely, independently of counterpressure and with little pulsation are suitable for the transport and the necessary accuracy during metering (I). Accordingly, diaphragm pumps, gear pumps, eccentric screw pumps (Mohno pumps), peristaltic pumps and piston pumps are preferred. Gear pumps and eccentric screw pumps (Mohno pumps) are particularly preferred.

Preferred metered amounts are dependent on the dimensioning of the support film to be coated but are usually in the range from 2 ml/min to 2000 ml/min, particularly preferably in the range from 2 ml/min to 500 ml/min.

If necessary, devolatilization (II) of the individual components or the total mixture can also be carried out under a reduced pressure of, for example, 1 mbar. Devolatilization, in particular after addition of the component A), is preferred in order to prevent bubble formation by residual gases or readily vaporizable components in the photopolymers prepared.

During devolatilization, dissolved gases or readily vaporizable components, such as readily volatile solvents are removed from the fluids (for example by ambient air introduced) and the fluid to be devolatilized may additionally be subsaturated. Inter alia, vacuum degasers, membrane degasers, centrifugal degasers, ultrasonic degasers and thin-film degasers and combinations of said technologies can be used as industrial degasers.

The filtration (III) serves for separating solid particles from the liquid medium and is used in particular as a purification step for the liquid components. As a rule, tube filters and plate filters are used in the coating industry. Preferred particle size distributions are between 0.1 µm and 5 µm, and particularly preferred particle size distributions are in the range from 0.2 µm to 1 µm.

All methods and apparatuses known per se to the person skilled in the art from mixing technology, such as, for example, stirred tanks and both dynamic and static mixers, can be used for the mixing (IV). However, apparatuses without dead spaces or with only small dead spaces are preferred. Furthermore, methods in which the mixing takes place within a very short time and with very vigorous mixing of the two components to be mixed are preferred. In particular, dynamic mixers, especially those in which the components come into contact with one another only in the mixer, are suitable for this purpose.

The temperatures are 0 to 100° C., preferably 10 to 80° C., particularly preferably 20 to 60° C.

Before the admixing of component A), the mixtures of components B) to G) can be stored as a storage-stable intermediate product, optionally over several months.

After the admixing of component A) of the polyurethane compositions according to the invention, a clear, liquid formulation is obtained, which cures within a few seconds to a few hours, depending on composition at room temperature.

The ratio and the type and reactivity of the synthesis components of the polyurethane compositions are preferably established so that the curing after admixing of the component A) occurs at room temperature within minutes to one hour. In a preferred embodiment, the curing is accelerated by heating the formulation after the admixing to temperatures between 30 and 180° C., preferably 40 to 120° C., particularly preferably 50 to 100° C.

Immediately after complete mixing of all components, the polyurethane compositions have viscosities at 25° C. of, typically, 10 to 100 000 mPa·s, preferably 100 to 20 000 mPa·s, particularly preferably 200 to 10 000 mPa·s, especially preferably 500 to 5000 mPa·s, so that they have very good processing properties even in solvent-free form. In solution with suitable solvents, viscosities at 25° C. of below 10 000 mPa·s, preferably below 2000 mPa·s, particularly preferably below 500 mPa·s, can be established.

Polyurethane compositions of the abovementioned type which cure with a catalyst content (component F) of 0.004% by weight to 0.1% by weight at 80° C. in less than 6 minutes have proved to be advantageous; concentrations between 0.01% by weight and 0.08% by weight are preferred and concentrations between 0.04% by weight and 0.06% by weight are particularly preferred.

The unrolling (V) of the support material is effected in batchwise processes using single-roll unwinders known to the person skilled in the art. In these batchwise processes, an individual uncoated roll is used in the unwinding apparatus and is fed in its complete length to the coating process. At the end of the roll, the coating process is stopped and the completely coated and rolled up support material is removed from the process at the winding station and packed in a product-specific manner. At the unwinding apparatus, a fresh uncoated roll is used and is fastened to the end of the previously produced support material by means of suitable adhesive films. After the machine has begun advancing the support material, the coating process can be continued.

In the continuous coating of the support materials, multiroll unwinders, which are arranged as turret-disc unwinders or turn-over bars are used. The critical transition from a batchwise process with the use of an uncoated support material roll to a continuous coating process without interrupting this coating process is carried out either with the aid of a web store or of a flying adhesion process known to the person skilled in the art.

A web store serves as a buffer for the stoppage phase during roll change and adhesion of the unwound roll. Here, after equipping of the material unwinding, the advance speed is increased stepwise to a value above the actual optimum coating speed. After the coating speed has been exceeded, the web store is completely filled with the support material. The advance speed is then adapted to the actual coating speed. Simultaneously, the second material unwinding device in the multiroll unwinder is equipped with a further uncoated roll. At the end of the previously used roll, the advance speed is immediately greatly reduced and stopped. By maintaining the coating speed, the web store is continuously emptied. Simultaneously, the beginning of the roll already provided at the second material unwinder is fastened to the end of the previously used roll by means of correspondingly suitable adhesive materials. Thereafter, the advance speed is started again and increased stepwise above the coating speed in order to fill the web store again. Simultaneously, the multiroll unwinder (in rotary disc version or as a turn-over bar) is pivoted through 180°. During the entire sequence of material change, the coating speed is kept constant via the process control with the aid of additional auxiliary drives.

Web guide units known to the person skilled in the art are used for controlling the support material in the transverse direction to the advance direction. The position of the web edge is determined with the aid of optical sensors, such as, for example, reflection sensors, transmitted-light sensors or ultrasonic sensors, and mechanically corrected with the aid of control roller systems which are positioned on a driven rotating frame.

In the cleaning of the support material, a distinction is made between two different cleaning methods: surface cleaning with contact and noncontact surface cleaning. The cleaning method with contact comprises cleaning brushes which are equipped with special soft bristle materials. A disadvantage of this method is the occurrence of defects in the support material which may result from the contact of the brush with the support material. Process parameters, such as speed of revolution, brush material and the distance to the support material, have to be adapted in this regard.

Noncontact methods, such as, for example, ionization units, suction channels or air blowers, are material-protecting methods in this respect. These ionization units produce positive and negative ions which neutralize the surface charges on the support material. Consequently, static charges on the support material, which result in the attraction of dust and particles from the environment, are avoided. Optionally, the cleaning systems are equipped with additional suction channels which transport particles away from the surface of the support material. This is supported by the use of a specially arranged flat-jet nozzle which detaches and blows away dust and particles from the surface by means of a fine compressed-air jet. These particles are likewise transported away via the installed suction channels and are filtered. The methods described for web cleaning can be arranged and combined in any desired sequence and positioning.

For improving the adhesion properties of the support materials, corona and plasma pretreatment systems known to the person skilled in the art are used. The support material is exposed to an electronic high-voltage discharge which occurs between an earthed and polished steel or aluminium roller and a closely adjacent insulated electrode. Only the side facing the electrode is treated. Here, customary electrodes are supplied with an AC voltage of 10 to 20 kV and a frequency of between 10 and 60 kHz by means of high frequency generators.

For application to a support material (coating, VI) or in a mould, all respective customary methods known to the person skilled in the art are suitable, such as, for example, knife coating, casting, printing, screen printing, spraying or inkjet printing. Knife coaters and slot nozzles are preferably suitable as film coating methods.

For the coating methods described, surface tensions of the polyurethane compositions described, which surface tensions are known to the person skilled in the art, are adapted with the aid of the additives described. Preferred surface tensions here are between 10 mN/m and 50 mN/m, particularly preferably from 20 mN/m to 40 mN/m.

Preferred coating widths are between 100 mm and 3000 mm; widths in the range from 300 mm to 2000 mm are particularly preferred.

Substrate speeds are preferably in the range from 0.2 in/min to 300 m/min. Particularly preferred substrates speeds are to be found in the range from 1.0 m/min to 50 m/min.

Applied dry layer thicknesses for knife coaters and slot nozzles are preferably not more than 200 µm, particularly preferably 3 µm to 100 µm, very particularly preferably 15 µm to 60 µm.

The drying (VII) of the coated substrate is preferably effected at a temperature of 30° C. to 180° C., particularly preferably of 40° C. to 120° C., very particularly preferably of 50° C. to 100° C.

Figure 1:
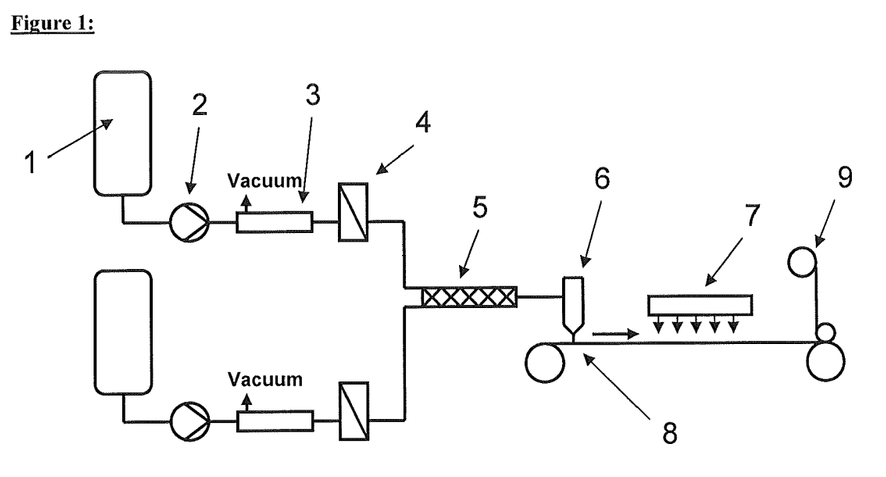
FIG. 1 illustrates an overview of the combination of the individual production steps for producing a coated substrate according to an embodiment of the present invention.

In a preferred embodiment, the metering of the starting materials is effected either by gear pumps or by eccentric screw pumps. Centrifugal degasers are used for devolatilization of the starting materials and plate filters for the filtering. The individual components are mixed via a static mixer having appropriately designed mixing geometries, such as, for example, length and diameter. A slot nozzle is used as a preferred coating unit. The coated material is dried via air dryers at the desired air temperature and moisture content over a defined period. FIG. 1 shows an overview of the described combination of the individual production steps for a coated substrate.

FIG. 1: Schematic setup of a typical coating unit, including arrangement of the pretreatment of the coating material (1-5), schematic path of the support material (8+9), coating device for application to a support material (6) and subsequent drying process (7).

Reference numerals in FIG. 1:

| | |
|---|---|
| 1 | storage container |
| 2 | metering device |
| 3 | vacuum devolatilization |
| 4 | filter |
| 5 | static mixer |
| 6 | coating device |
| 7 | dryer |
| 8 | web path |
| 9 | product lamination |

By combining the process steps described, shown in FIG. 1, greater accuracy of layer thickness is achieved at applied photopolymer layer thicknesses on moving support materials.

The present invention furthermore relates to articles which are obtained by coating a transparent substrate with the prepolymer-based polyurethane formulation described.

This is a photosensitive (spectral wavelength range 400 to 800 nm of the electromagnetic spectrum) product which has a film composite comprising at least cast film or support material (substrate), the photopolymer layer, which is produced from the formulation described, and an outer or laminating film. Further films may be present in the film composite.

Preferred materials or material composites of the support layer are based on polycarbonate (PC), polyethylene terephthalate (PET), polybutylene terephthalate, polyethylene, polypropylene, cellulose acetate, cellulose hydrate, cellulose nitrate, cycloolefin polymers, polystyrene, polyepoxides, polysulphone, cellulose triacetate (CTA), polyamide, polymethyl methacrylate, polyvinyl chloride, polyvinyl butyral or polydicyclopentadiene or mixtures thereof. In addition, material composites such as film laminates or coextrudates can be used as support film. Examples of material composites are duplex and triplex films having a structure according to one of the schemes A/B, A/B/A or A/B/C, such as PC/PET, PET/PC/PET and PC/TPU (TPU=thermoplastic polyurethane). PC and PET are particularly preferably used as support film.

Transparent supports which are optically clear, i.e. not hazy, are preferred. The haze is measurable via the haze value, which is less than 3.5%, preferably less than 1%, particularly preferably less than 0.3%.

The haze value describes the fraction of the transmitted light which is scattered in a forward direction by the sample exposed to light. Thus, it is a measure of the opacity or haze of transparent materials and quantified material defects, particles, inhomogeneities or crystalline phase boundaries in the material or its surface which interfere with the transparency. The method for measuring the haze is described in the standard ASTM D 1003.

The support preferably has a birefringence which is not too high, i.e. typically a mean optical retardation of less than 1000 nm, preferably of less than 700 nm, particularly preferably of less than 300 nm.

The retardation R is the mathematical product of the birefringence $\Delta n$ and the thickness of the support d. The automatic and objective measurement of the retardation is effected using an imaging polarimeter, for example from ilis GmbH, StainMatic® M3/M model.

The retardation is measured in perpendicular incidence. The retardation values stated for the support are lateral mean values.

The support, including possible coatings on one or both sides, typically has a thickness of 5 to 2000 µm, preferably 8 to 300 µm, particularly preferably 30 to 200 µm and in particular 125 to 175 µm or 30 to 45 µm.

In addition to the constituents the film composite can have one or more covering layers on the photopolymer layer in order to protect this from dirt and environmental influences. Plastics films or film composite systems, but also clear coats, can be used for this purpose.

Film materials analogous to materials used in the support layer are preferably used as covering layers, these having a thickness of, typically, 5 to 200 µm, preferably 8 to 125 µm, particularly preferably 20 to 50 µm.

Cover layers having a surface which is as smooth as possible are preferred. The roughness determined according to DIN EN ISO 4288 "Geometric Product Specification (GPS)—Surface Texture . . . ", test condition R3z front and back, is used as a measure. Preferred roughnesses are in the region of less than or equal to 2 µm, preferably less than or equal to 0.5 µm.

PE or PET films having a thickness of 20 to 60 µm are used as laminating films; a polyethylene film of 40 µm thickness is particularly preferably used.

Further protective layers, for example a lower lamination of the support film, can be used.

The present invention furthermore relates to the use of the media according to the invention for recording visual holograms, for producing optical elements, images, for displays and a method for recording holograms using the polyurethane compositions according to the invention and the media or holographic films obtainable therefrom.

Holograms for optical applications in the entire visible range and in the near UV range (300-800 nm) can be produced by appropriate exposure processes using the photopolymer films essential to the invention. Visual holograms comprise all holograms which can be recorded by a method known to the person skilled in the art, including, inter alia, in-line (Gabor) holograms, off-axis holograms, full-aperture transfer holograms, white light transmission holograms ("rainbow holograms"), Denisyuk holograms, off-axis reflection holograms, edge-lit holograms and holographic stereograms; reflection holograms, Denisyuk holograms, transmission holograms are preferred. Optical elements, such as lenses, mirrors, deflecting mirrors, filters, diffusion screens, diffraction elements, light conductors, waveguides, projection screens and/or masks are preferred. Frequently, these optical elements show a frequency selectivity, depending on how the holograms were exposed and which dimensions the hologram has.

In addition, holographic images or displays can also be produced by means of photopolymer films essential to the invention, such as, for example, for personal portraits, biometric representations in security documents, or generally of images or image structures for advertising, security labels, trade mark protection, trade mark branding, labels, design elements, decorations, illustrations, reward cards, images and the like and images which can represent digital data, inter alia also in combination with the products described above. Holographic images can give the impression of a three-dimensional image, but they can also represent image sequences, short films or a number of different objects, depending on the angle from which they are illuminated, the light source (including moving ones) to which they are exposed, etc. Owing to these varied design possibilities, holograms, in particular volume holograms, are an attractive technical solution for the abovementioned application.

EXAMPLES

Starting Materials:

Desmodur® XP 2599 is an experimental product of Bayer MaterialScience AG, Leverkusen, Germany, full allophanate of hexane diisocyanate on Acclaim 4200, NCO content: 5.6-6.4%

Prepolymer 1 is an experimental product of Bayer MaterialScience AG, Leverkusen, Germany, urethane of hexane diisocyanate and Acclaim 2200, NCO content: 3.2-3.75%

Polyol 1 (Acclaim® 4200) is a polypropylene oxide having a number average molar mass of 4000 g/mol from Bayer MaterialScience AG, Leverkusen, Germany.

Polyol 2 (Acclaim® 4220 N) is an ethylene oxide-capped polypropylene oxide having a number average molar mass of 4000 g/mol from Bayer MaterialScience AG, Leverkusen, Germany.

Polyol 3 (Acclaim® 2200) is a polypropylene oxide having a number average molar mass of 2000 g/mol from Bayer MaterialScience AG, Leverkusen, Germany.

Urethane acrylate 1 is an experimental product of Bayer MaterialScience AG, Leverkusen, Germany, urethane acrylate based on HEA and Desmodur® RFE.

Fomrez® UL28: urethanization catalyst, dimethylbis[(1-oxoneodecl)oxy]stannane, commercial product of Momentive Performance Chemicals, Wilton, Conn., USA (used as 10% strength solution in N-ethylpyrrolidone).

CGI 909: borate-based coinitiator of Ciba Inc., Basle, Switzerland.

New methylene blue (zinc-free): dye from Sigma-Aldrich Chemie GmbH, Steinheim, Germany.

Ethyl violet: dye from MP Biomedicals LLC, Solon, Ohio, USA.

Astrazon orange G: dye from Sigma-Aldrich Chemie GmbH, Steinheim, Germany.

Byk 310: silicone-based surface additive from BYK-Chemie GmbH, Wesel, Germany (solution about 25% strength in xylene).

Figure 7:
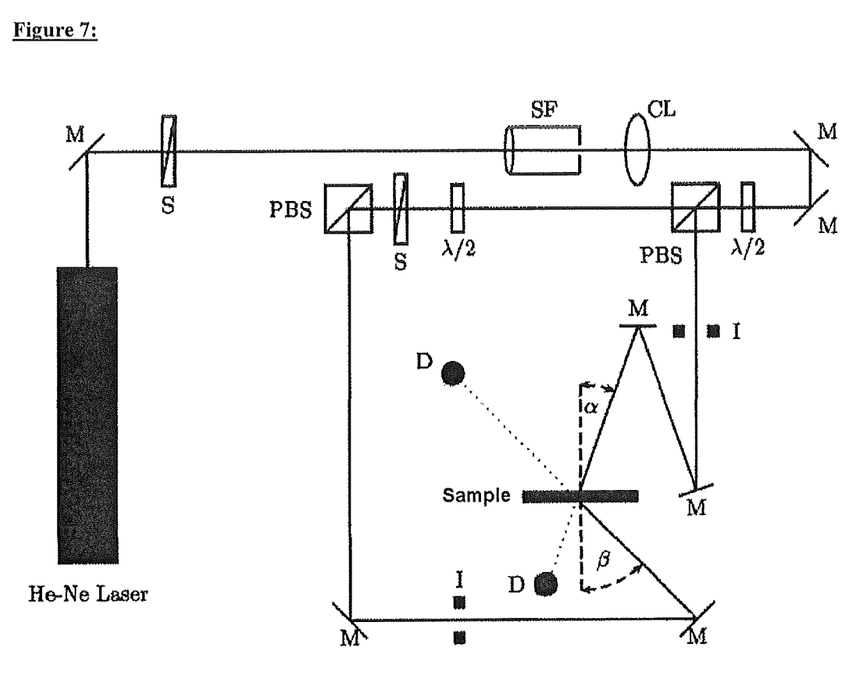
FIG. 7 illustrates a measuring arrangement to measure holographic properties.

Measurement of diffraction efficiency DE and refractive index contrast $\Delta n$:

The media according to the invention produced in the experimental part and comparative media were tested with regard to their holographic properties by means of a measuring arrangement according to FIG. 7:

FIG. 7: Geometry of a holographic media tester at $\lambda$=633 nm (He—Ne laser) for writing a reflection hologram: M=mirror, S=shutter, SF=spatial filter, CL=collimator lens, $\lambda/2=\lambda/2$ plate, PBS=polarization-sensitive beam splitter, D=detector, I—iris diaphragm, $\alpha$=21.8° and $\beta$=41.8° are the angles of incidence of the coherent beams, measured outside the sample (outside the medium).

The laminating film is peeled off from the film composite and the photopolymer material is then laminated with glass so that the substrate film faces outwards.

The beam of an He—Ne laser (emission wavelength 633 nm) was converted with the aid of the spatial filter (SF) and together with the collimation lens (CL) into a parallel homogeneous beam. The final cross sections of the signal and reference beam are established by the iris diaphragms (I). The diameter of the iris diaphragm opening is 4 mm Polarization-dependent beam splitters (PBS) split the laser beam into two coherently equally polarized beams. Via the $\lambda/2$ plates, the power of the reference beam was adjusted to 0.5 mW and the power of the signal beam to 0.65 mW. The powers were determined using the semiconductor detectors (D) with sample removed. The angle of incidence ($\alpha$) of the reference beam is 21.8° and the angle of incidence ($\beta$) of the signal beam is 41.8°. At the location of the sample (medium), the interference field of the two overlapping beams produced a grating of light and dark strips which are perpendicular to the angle bisectors of the two beams incident on the sample (reflection hologram). The strip spacing in the medium is ~225 nm (refractive index of the medium is ~1.49).

Holograms were written into the medium in the following manner:

Both shutters (S) are opened for the exposure time t. Thereafter, with shutters (S) closed, the medium was allowed a time of 5 minutes for diffusion of the still unpolymerized writing monomers. The holograms written were now read in the following manner. The shutter of the signal beam remained closed. The shutter of the reference beam was opened. The iris diaphragm of the reference beam was closed to a diameter of <1 mm. This ensured that the beam was always completely in the previously written hologram for all angles ($\Omega$) of rotation of the medium. The turntable, under computer control, covered the angle range from $\Omega$=0° to $\Omega$=20° with an angle step width of 0.05°. At each angle approached, the powers of the beam transmitted in the zeroth order were measured by means of the corresponding detector D and the powers of the beam diffracted in the first order were measured by means of the detector D. The diffraction efficiency $\eta$ was obtained at each angle $\Omega$ approached as the quotient of:

$$\eta = \frac{P_D}{P_D + P_T}$$

$P_D$ is the power in the detector of the diffracted beam and $P_T$ is the power in the detector of the transmitted beam.

By means of the method described above, the Bragg curve (it describes the diffraction efficiency $\eta$ as a function of the angle $\Omega$ of rotation of the written hologram) was measured and was stored in a computer. In addition, the intensity transmitted in the zeroth order was also plotted against the angle $\Omega$ of rotation and stored in a computer.

The maximum diffraction efficiency (DE=$\eta_{max}$) of the hologram, i.e. its peak value, was determined. It may have been necessary for this purpose to change the position of the detector of the diffracted beam in order to determine this maximum value.

The refractive index contrast Δn and the thickness d of the photopolymer layer were now determined by means of the coupled wave theory (cf.: H. Kogelnik, The Bell System Technical Journal, Volume 48, November 1969, Number 9, page 2909-page 2947) from the measured Bragg curve and the variation of the transmitted intensity as a function of angle. The method is described below:

According to Kogelnik, the following is true for the Bragg curve η/(Ω) for a reflection hologram:

$$\eta = \frac{1}{1 + \frac{1-(\chi/\Phi)^2}{\sinh^2(\sqrt{\Phi^2 - \chi^2})}}$$

with:

$$\Phi = \frac{\pi \cdot \Delta n \cdot d}{\lambda \cdot \sqrt{\cos(\alpha') \cdot \cos(\alpha' - 2\psi)}}$$

$$\chi = \Delta\theta \cdot \frac{2\pi \cdot \sin(\alpha' - \psi)}{\Lambda \cdot \cos(\alpha' - 2\psi)} \cdot \frac{d}{2}$$

$$\psi = \frac{\beta' - \alpha'}{2}$$

$$\Lambda = \frac{\lambda}{2 \cdot n \cdot \cos(\psi - \alpha')}$$

$$n \cdot \sin(\alpha') = \sin(\alpha), \; n \cdot \sin(\beta') = \sin(\beta)$$

$$\Delta\theta = -\Delta\Omega \cdot \sqrt{\frac{1 - \sin^2(\alpha)}{n^2 - \sin^2(\alpha)}}$$

$\Phi$ is the grating thickness, $\chi$ is the detuning parameter and $\Psi$ is the angle of tilt of the refractive index grating which was written, $\alpha'$ and $\beta'$ correspond to the angles $\alpha$ and $\beta$ during writing of the hologram, but in the medium. $\Delta\Theta$ is the angle detuning measured in the medium, i.e. the deviation from the angle $\alpha'$. $\Delta\Omega$ is the angle detuning measured outside the medium, i.e. the deviation from the angle $\alpha$. n is the average refractive index of the photopolymer and was set at 1.504.

The maximum diffraction efficiency (DE=$\eta_{max}$) is then obtained for $\chi$=0, i.e. $\Delta\Omega$=0, as:

$$DE = \tanh^2(\Phi) = \tanh^2\left(\frac{\pi \cdot \Delta n \cdot d}{\lambda \cdot \sqrt{\cos(\alpha') \cdot \cos(\alpha' - 2\psi)}}\right)$$

Figure 8:
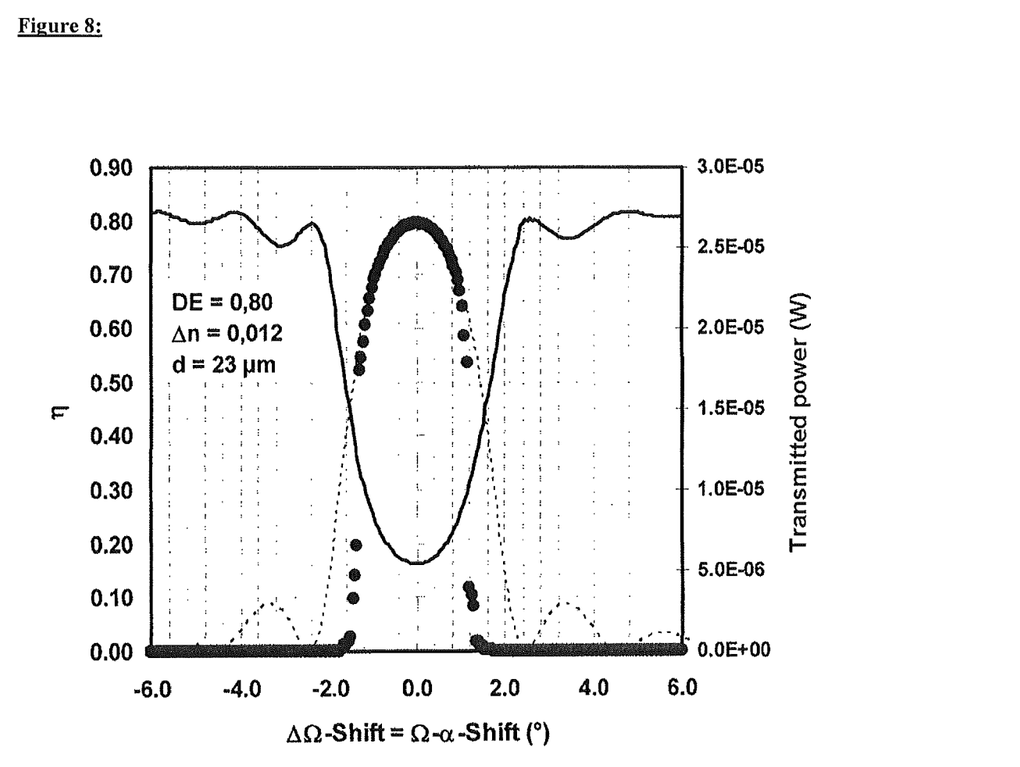
FIG. 8 illustrates the measured data of the diffraction efficiency, the theoretical Bragg curve and the transmitted intensity of a film coated according to an embodiment of the present invention

The measured data of the diffraction efficiency, the theoretical Bragg curve and the transmitted intensity are shown in FIG. 8 plotted against the centred angle of rotation Ω-α shift. Since, owing to the geometric shrinkage and the change in the average refractive index during the photopolymerization, the angle at which DE is measured differs from α, the x axis is centred around this shift. The shift is typically 0° to 2°.

Since DE is known, the shape of the theoretical Bragg curve according to Kogelnik is determined only by the thickness d of the photopolymer layer. Δn is subsequently corrected via DE for a given thickness d so that measurement and theory of DE always agree. d is now adapted until the angle positions of the first secondary minima of the theoretical Bragg curve agree with the angle positions of the first secondary maxima of the transmitted intensity and additionally the full width at half maximum (FWHM) for the theoretical Bragg curve and the transmitted intensity agree.

Since the direction in which a reflection hologram concomitantly rotates on reconstruction by means of an Ω scan, but the detector for the diffracted light can detect only a finite angle range, the Bragg curve of broad holograms (small d) is not completely detected in an Ω scan, but only the central region, with suitable detector positioning. That shape of the transmitted intensity which is complementary to the Bragg curve is therefore additionally used for adapting the layer thickness d.

FIG. 8: Plot of the Bragg curve η according to Kogelnik (dashed line), of the measured diffraction efficiency (solid circles) and of the transmitted power (black solid line) against the angle detuning ΔΩ. Since, owing to geometric shrinkage and the change in the average refractive index during the photopolymerization, the angle at which DE is measured differs from α, the x axis is centred around this shift. The shift is typically 0° to 2°.

For a formulation, this procedure was possibly repeated several times for different exposure times t on different media in order to determine the average energy dose of the incident laser beam at which DE reaches the saturation value during writing of the hologram. The average energy dose E is obtained as follows:

$$E(\text{mJ/cm}^2) = \frac{2 \cdot [0.50 \text{ mW} + 0.67 \text{ mW}] \cdot t(s)}{\pi \cdot 0.4^2 \text{ cm}^2}$$

The powers of the part-beams were adapted so that the same power density is achieved in the medium at the angles α and β used.

Alternatively, a test equivalent to the setup shown in FIG. 7 was also carried out using a green laser having the emission wavelength λ in vacuo of 532 nm. Here, α=11.5° and β=33.5° and $P_\alpha$=1.84 mW and $P_\beta$=2.16 mW.

The physical layer thickness was determined using commercially available white light interferometers, such as, for example, the device FTM-Lite NIR layer thickness meter from Ingenieursbüro Fuchs.

The determination of the layer thickness is based in principle on interference phenomena on thin layers. Light waves which have been reflected at two interfaces of different optical density are superposed one on the other. The undisturbed superposition of the reflected part-beams now leads to periodic brightening and extinction in the spectrum of a white continuum radiator (e.g. halogen lamp). This superposition is referred to as interference by the person skilled in the art. These interference spectra are measured and are mathematically evaluated.

Preparation of the Urethane Acrylate 1:

0.1 g of 2,6-di-tert-butyl-4-methylphenol, 0.05 g of dibutyltin dilaurate (Desmorapid Z, Bayer MaterialScience AG, Leverkusen, Germany) and and 213.07 g of a 27% strength solution of tris(p-isocyanatophenyl)thiophosphate in ethyl acetate (Desmodur® RFE, product of Bayer MaterialScience AG, Leverkusen, Germany) were initially introduced into a 500 ml round-bottomed flask and heated to 60° C. Thereafter, 42.37 g of 2-hydroxyethyl acrylate were added dropwise and the mixture was further kept at 60° C. until the isocyanate content had fallen below 0.1%. Thereafter, cooling was effected and the ethyl acetate was completely removed in vacuo. The product was obtained as a semicrystalline solid.

Comparative Example 1

Photopolymer, Internally HOEN 0076

5.00 g of urethane acrylate 1 (component C), then 0.100 g of Fomrez® UL 28 (component F) and 0.060 g of Byk 310

(component G) and finally a solution of 0.300 g of CGI 909, 0.010 g of new methylene blue, 0.010 g of ethyl violet and 0.010 g of astrazon orange G (together component E) in 0.610 g of N-ethylpyrrolidone (component G) were added stepwise in the dark to 10.222 g of polyol 1 (component B) and mixing was effected so that a clear solution was obtained. Thereafter, 3.678 g of Desmodur® XP 2599 (component A) were added at 30° C. and mixing was effected again. The liquid material obtained was then applied to a 175 µm thick polycarbonate film using an automatically driven film applicator with an application speed of 3 mm/second and an applicator gap of 50 µm and was dried for 4.5 minutes at 80° C. Dry layer thickness: 30 µm, maximum Δn: 0.012 (633 nm).

For the continuous production according to the invention of the holographic film materials, the component C, the component D (which may already have been predissolved in the component C) and optionally the component G and F are dissolved in the component B, optionally at 60° C., and thoroughly mixed. Thereafter, the component E in pure form or in dilute solution in NEP is weighed in the dark or under suitable illumination and mixing is effected again. Optionally, heating is effected for not more than 10 minutes in a drying oven at 60° C. The mixture obtained can be devolatilized with stirring at <10 mbar.

The component A can likewise be devolatilized with stirring at <10 mbar. Thereafter, the two formulations are continuously metered and mixed by means of positive metering pumps via one of the abovementioned mixing methods. Thereafter, the mixture is applied continuously and homogeneously to a support film via an application unit, such as, for example, a knife coater or a slot nozzle.

The coated support films are dried at about 80° C. and then covered with one of the abovementioned covering layers and packed in light-tight packaging.

The thickness d of the photopolymer layer is obtained from the coating parameters of the corresponding coating device, which are known to the person skilled in the art.

The following examples are mentioned for illustrating the method according to the invention but are not to be understood as being limiting. Unless noted otherwise, all percentages of the photopolymers are based on percent by weight.

Example 1

Photopolymer, Internally KOHC 178-07

13.75 g of urethane acrylate 1 (component C), then 0.275 g of Fomrez® UL 28 (component F) and 0.165 g of Byk 310 (component G) and finally a solution of 0.825 g of CGI 909, 0.028 g of new methylene blue, 0.028 g of ethyl violet and 0.028 g of astrazon orange G (together component E) in 1.678 g of N-ethylpyrrolidone (component G) were added stepwise in the dark to 27.83 g of polyol 1 (component B) and mixing was then effected so that a clear solution was obtained. Thereafter, 10.395 g of Desmodur® XP 2599 (component A) were added at 30° C. and mixing was effected again. The liquid material obtained was then applied to a 175 µm thick polycarbonate film and dried for 4.5 minutes at 80° C. Dry layer thickness: 45 µm, maximum Δn: 0.016 (633 nm), 0.017 (532 nm).

Example 2

Photopolymer, Internally KOHC 246-05

5.00 g of urethane acrylate 1 (component C), then 0.100 g of Fomrez® UL 28 (component F) and 0.060 g of Byk 310 (component G) and finally a solution of 0.300 g of CGI 909, 0.010 g of new methylene blue, 0.010 g of ethyl violet and 0.010 g of astrazon orange G (together component E) in 0.610 g of N-ethylpyrrolidone (component G) were added stepwise in the dark to 10.245 g of polyol 2 (component B) and mixing was then effected so that a clear solution was obtained. Thereafter, 3.655 g of Desmodur® XP 2599 (component A) were added at 30° C. and mixing was effected again. The liquid material obtained was then applied to a 175 µm thick polycarbonate film and dried for 4.5 minutes at 80° C. Dry layer thickness: 25 µm, maximum Δn: 0.012 (633 nm), 0.010 (532 nm).

Example 3

Photopolymer, Internally KOHC 173-02

13.75 g of urethane acrylate 1 (component C), then 0.275 g of Fomrez® UL 28 (component F) and 0.165 g of Byk 310 (component G) and finally a solution of 0.825 g of CGI 909, 0.028 g of new methylene blue, 0.028 g of ethyl violet and 0.028 g of astrazon orange G (together component E) in 1.678 g of N-ethylpyrrolidone (component G) were added stepwise in the dark to 19.946 g of polyol 3 (component B) and mixing was then effected so that a clear solution was obtained. Thereafter, a mixture of 6.467 g of Desmodur® XP 2599 and 11.812 g of prepolymer 1 (together component A) was added at 30° C. and mixing was effected again. The liquid material obtained was then applied to a 175 µm thick polycarbonate film and dried for 4.5 minutes at 80° C. Dry layer thickness: 32 µm, maximum Δn: 0.016 (633 nm), 0.017 (532 nm).

Example 4

Photopolymer, Internally KOHC 227-07

5.00 g of urethane acrylate 1 (component C), then 0.100 g of Fomrez® UL 28 (component F) and 0.060 g of Byk 310 (component G) and finally a solution of 0.300 g of CGI 909, 0.010 g of new methylene blue, 0.010 g of ethyl violet and 0.010 g of astrazon orange G (together component E) in 0.610 g of N-ethylpyrrolidone (component G) were added stepwise in the dark to 8.432 g of polyol 3 (component B) and mixing was then effected so that a clear solution was obtained. Thereafter, 5.468 g of Desmodur® XP 2599 (component A) were added at 30° C. and mixing was effected again. The liquid material obtained was then applied to a 36 µm thick polyethylene terephthalate film and dried for 4.5 minutes at 80° C. Dry layer thickness: 30 µm, maximum Δn: 0.013 (633 nm), 0.014 (532 nm).

Figure 2:
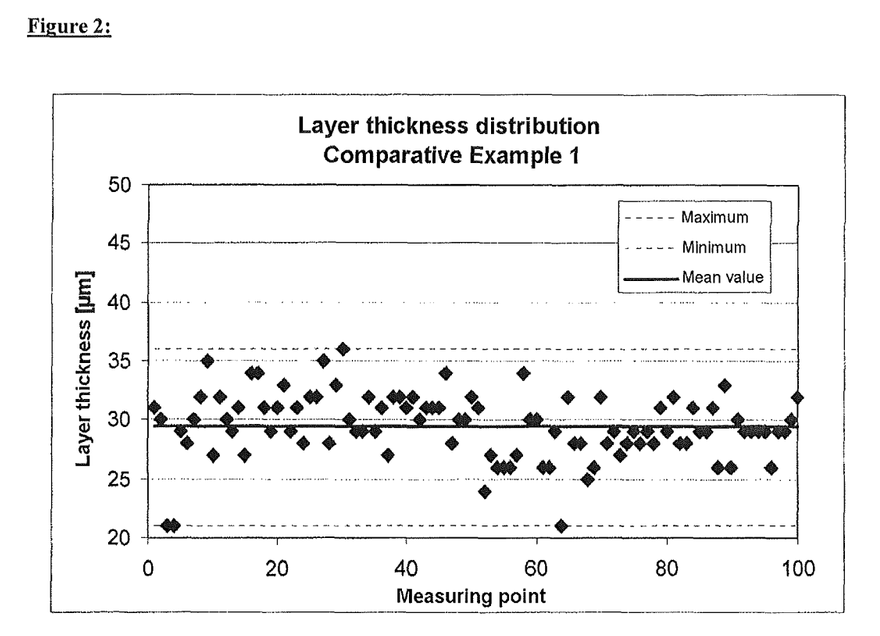
FIG. 2 illustrates a topographic layer thickness distribution using a conventional laboratory coating device of comparative example 1.
Figure 3:
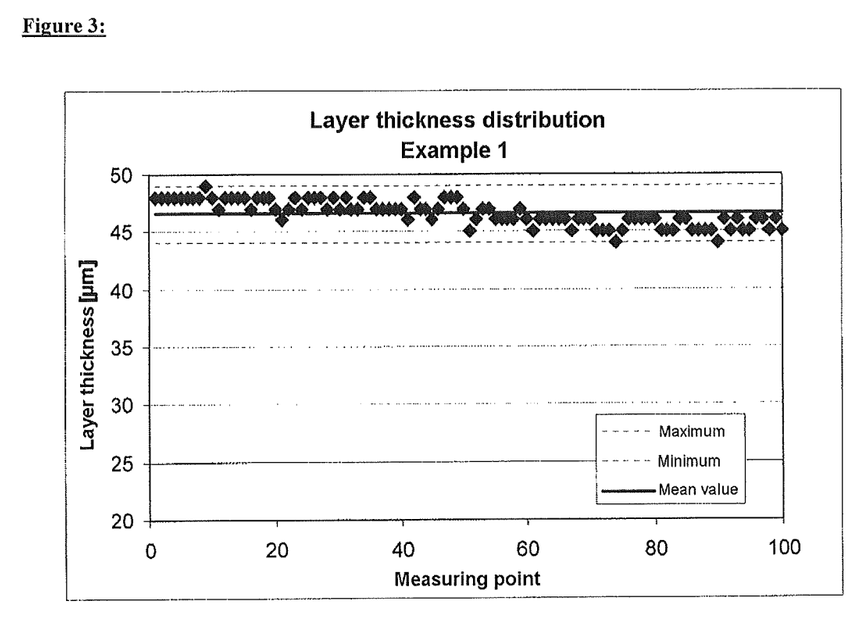
FIG. 3 illustrates a topographic layer thickness distribution using a conventional laboratory coating device of example 1.
Figure 4:
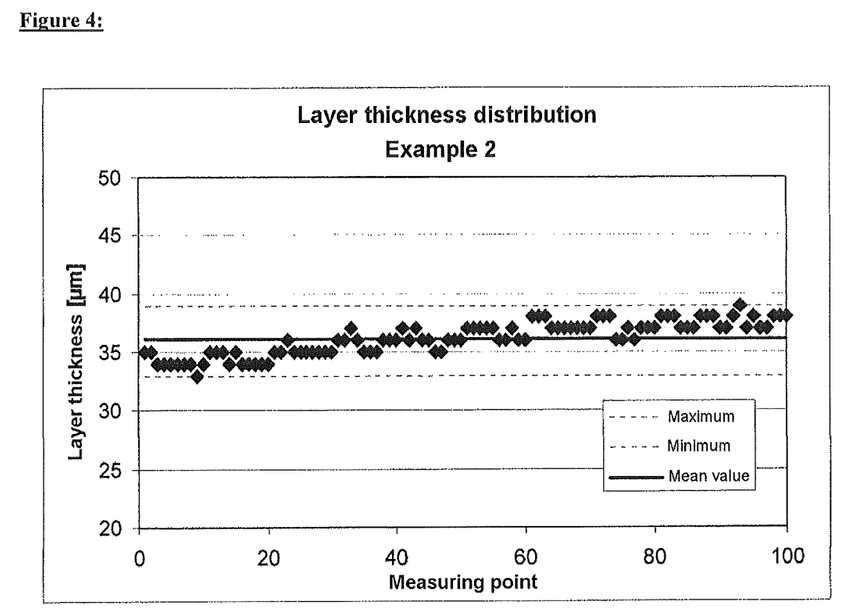
FIG. 4 illustrates a topographic layer thickness distribution using a conventional laboratory coating device of example 2.
Figure 5:
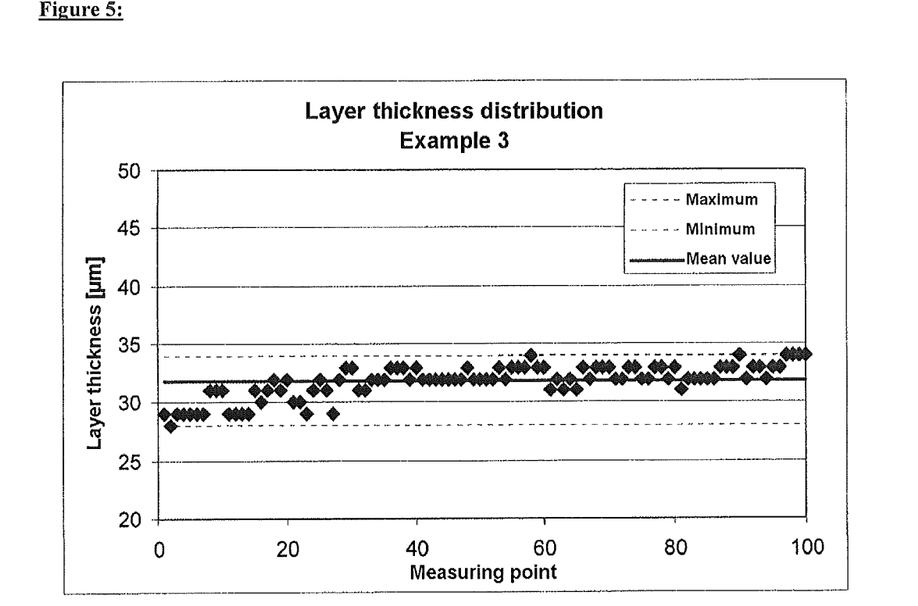
FIG. 5 illustrates a topographic layer thickness distribution using a conventional laboratory coating device of example 3.
Figure 6:
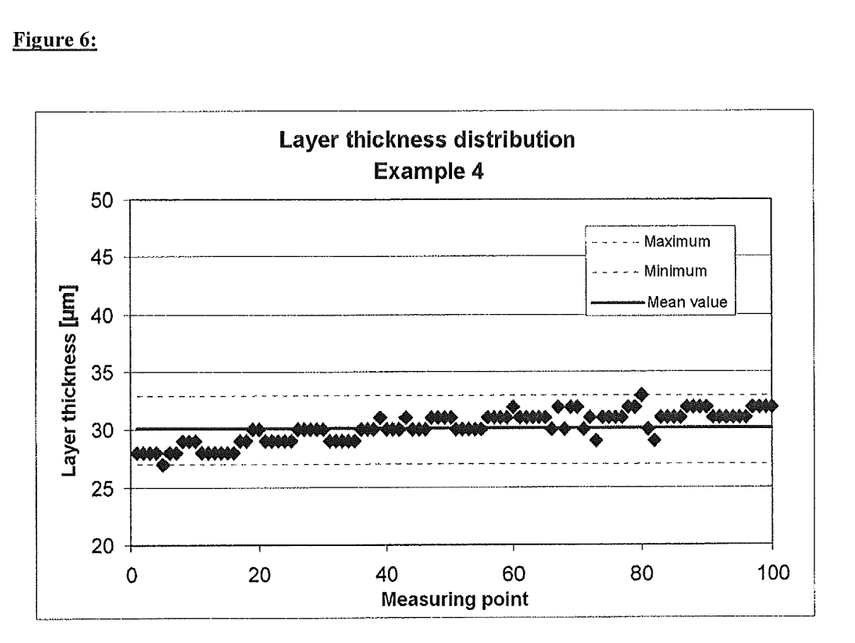
FIG. 6 illustrates a topographic layer thickness distribution using a conventional laboratory coating device of example 4.

FIG. 2 shows a topographic layer thickness distribution using a conventional laboratory coating device, such as, for example, hand coating frame, spiral applicators or an automatically driven film applicator (Comparative Example 1). In these methods, a sufficient volume of coating material is introduced before the applicator. The applicator is then drawn manually at virtually uniform speed over the support material so that a uniform film forms on the support material. This can be supplemented by an automatically driven film applicator and thus optimized Furthermore, the coating quality of the methods described is greatly influenced by the choice of a suitable substrate. Here, glass and rubber materials are preferably used.

FIG. 2: Layer Thickness Distribution on Production Using Conventional Laboratory Coating Devices As shown in FIG. 3-7, a higher layer thickness accuracy can be achieved by the continuous roll coating shown in FIG.

1. A list of the results obtained is shown in Table 1. The improvement of the layer thickness distribution of Example 1 can be clearly demonstrated from the reduction of standard deviation with the use of roll coating (Example 2-5). Furthermore, the comparisons of the measured minimum and maximum layer thicknesses (see difference) show a substantial reduction in the range of the layer thicknesses achieved. More uniform coatings are achieved thereby. The achievement of uniform layer thickness distribution of the photopolymer is important in order to be able to guarantee a uniform brightness of the holograms over a relatively large area. Since the brightness of the holograms is directly dependent on the diffraction efficiencies and the spectral angle bandwidths, there is also a direct influence on the layer thickness via these parameters.

TABLE 1

Comparison of the layer thickness evaluation

| Number | Mean value [µm] | Standard-deviation [µm] | Maximum [µm] | Minimum [µm] | Difference [µm] |
|---|---|---|---|---|---|
| Comparative Example 1 | 29.5 | 2.8 | 36 | 21 | 15 |
| Example 1 | 46.6 | 1.2 | 49 | 44 | 5 |
| Example 2 | 36.2 | 1.4 | 39 | 33 | 6 |
| Example 3 | 31.8 | 1.4 | 34 | 28 | 6 |
| Example 4 | 30.2 | 1.3 | 33 | 27 | 6 |

FIG. 3-7: Optimized Layer Thickness Distribution on Production Using a Continuous Roll Coating

The invention claimed is:

1. A continuous process for the production of photopolymer films, comprising mixing components
    A) a polyisocyanate component which comprises an NCO-terminated polyurethane prepolymer having NCO groups primarily aliphatically bonded and which is based on hydroxy-functional compounds having an OH functionality of 1.6 to 2.05,
    B) isocyanate-reactive polyether polyols,
    C) urethane acrylates and/or urethane methacrylates having at least one aromatic structural unit and a refractive index of greater than 1.50 at 405 nm, wherein the urethane acrylates and/or urethane methacrylates are free of NCO groups and OH groups,
    D) free radical stabilizers,
    E) photoinitiators based on combinations of borate salts and one or more dyes having absorption bands which at least partly cover the spectral range from 400 to 800 nm,
    F) optionally catalysts, and
    G) optionally auxiliaries and additives,
    to form a polyurethane composition, wherein immediately after complete mixing of components A) through E), and optionally F) and G), said polyurethane composition has a viscosity at 25° C. in the range of from 200 to 10,000 mPa·s,
    and coating a support film by the roll-to-roll principle with said polyurethane composition, wherein said support film is moving at a speed in the range of from 0.2 m/min to 300 m/min.

2. The process according to claim 1, wherein the prepolymers in A) comprise urethanes or allophanates of aliphatic isocyanate-functional compounds and oligomeric or polymeric isocyanate-reactive compounds, and wherein the prepolymers have number average molar masses of 200 to 10 000 g/mol and NCO functionalities of 1.9 to 5.0.

3. The process according to claim 1, wherein the isocyanate-reactive polyether polyols B) comprise difunctional polyether polyols based on propylene oxide and ethylene oxide, having a proportion of ethylene oxide of less than 10% by weight, based on the total mass of the parent polyether, and a number average molar mass between 2000 and 4200 g/mol.

4. The process according to claim 1, wherein the urethane acrylates C) comprise adducts of aromatic triisocyanates or trimers of aromatic diisocyanates with hydroxyethyl acrylate, hydroxypropyl acrylate, 4-hydroxybutyl acrylate.

5. The process according to claim 1, further comprising
    I. transporting and metering the component A), optionally mixed with one or more of the components E), F) and G), and secondly, separately therefrom, of the component B), optionally mixed with one or more of the components C), D), E), F) and G)
    II. devolatilizing the streams transported, metered and optionally premixed according to I)
    III. filtering of the mixture obtained according to II)
    IV. homogenizing of the mixture obtained according to III)
    V. unrolling and pretreating the support film
    VI. coating the support film with the mixture obtained according to step IV)
    VII. drying the support film coated according to VI)
    VIII. laminating the coated film obtained according to VII)
    IX. rolling up the laminated film obtained according to VIII).

6. The process according to claim 5, wherein the metering of the starting materials in step I) is performed using either gear or eccentric screw pumps, the devolatilization of the starting materials in II) is performed using centrifugal degassers, the filtration in III) is performed using plate filters, the homogenization of the mixture of the individual components in IV) is performed using static mixers, the coating of the support film in VI) is performed using a slot nozzle, and the drying of the coated support film in VII) is performed using air dryers.

7. The process according to claim 5, wherein PE or PET films having a thickness of 20 to 60 µm are used for the lamination.

8. The process according to claim 1, wherein the support film is based on one or more compounds selected from the group consisting of polycarbonate (PC), polethylene terephthalate (PET), polybutylene terephthalate, polyethylene, polypropylene, cellulose acetate, cellulose hydrate, cellulose nitrate, cycloolefin polymers, polystyrene, polyepoxides, polysulfone, cellulose triacetate (CTA), polyamide, polymethyl methacrylate, polyvinyl chloride, polyvinyl butyral, polydicyclopentadiene, and mixtures thereof.

9. The process according to claim 1, wherein the support film is optically transparent and has a haze, measured as the haze value, of less than 3.5%.

10. The process according to claim 1, wherein the support film has a mean optical retardation of less than 1000 nm.

11. The process according to claim 1, wherein the support film has a thickness of 5 to 2000 µm.

12. A photopolymer film suitable for recording visual holograms, obtained by the process according to claim 1.

13. An optical element or image or device for image display or projection comprising the photopolymer films according to claim 12.

14. The process according to claim 1, wherein the support film has a thickness of 8 to 125 µm.

* * * * *